United States Patent
Toda et al.

(10) Patent No.: US 7,193,269 B2
(45) Date of Patent: Mar. 20, 2007

(54) MOS SEMICONDUCTOR DEVICE

(75) Inventors: Akio Toda, Tokyo (JP); Haruihiko Ono, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/498,377

(22) PCT Filed: Dec. 9, 2002

(86) PCT No.: PCT/JP02/12861

§ 371 (c)(1),
(2), (4) Date: Sep. 17, 2004

(87) PCT Pub. No.: WO03/050871

PCT Pub. Date: Jun. 19, 2003

(65) Prior Publication Data

US 2005/0032275 A1    Feb. 10, 2005

(30) Foreign Application Priority Data

Dec. 10, 2001    (JP)    ............................. 2001-375202

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ...................... 257/328; 257/327; 257/338; 257/350; 257/351; 257/357; 257/369; 257/371; 257/510

(58) Field of Classification Search ........ 257/327–328, 257/338, 350–351, 357, 369, 371, 510
See application file for complete search history.

(56) References Cited

U.S. PATENT DOCUMENTS 5,006,913 A * 4/1991 Sugahara et al. ............. 257/67

(Continued)

FOREIGN PATENT DOCUMENTS

EP    0 967 636 A2    12/1999

(Continued)

OTHER PUBLICATIONS

A. Shimizu, "Local Mechanical-Stress Control (LMC): A New Technique for CMOS-Performance Enhancement", International Electron devices Meeting 2001, IEDM Technical Digest, Dec. 2, 2001, pp. 433-436.

(Continued)

*Primary Examiner*—Ida M. Soward
(74) *Attorney, Agent, or Firm*—McGinn IP Law Group, PLLC

(57) ABSTRACT

While using conventional manufacturing processes, it is intended to apply a compressive strain in the channel direction to the p-channel MOS field effect transistor and also apply a tensile strain in the channel direction to the n-channel MOS field effect transistor for increasing both MOS currents. In the MOS semiconductor device isolated by a trench device isolation regions, the p-channel MOS field effect transistor is designed so that a length of a source/drain region in the channel direction is not more than 1 micrometer, and the gate length is not more than 0.2 micrometers. The n-channel MOS field effect transistor is designed so that a face of the source/drain region in parallel to the gate width direction is adjacent to the device isolation film with the inserted silicon nitride film, and a face of the source/drain region parallel to the gate length direction is adjacent to the device isolation film including the silicon oxide film only.

23 Claims, 14 Drawing Sheets

U.S. PATENT DOCUMENTS

| | | | |
|---|---|---|---|
| 5,683,934 A * | 11/1997 | Candelaria | 438/151 |
| 5,852,310 A * | 12/1998 | Kadosh et al. | 257/67 |
| 6,010,948 A * | 1/2000 | Yu et al. | 438/436 |
| 6,211,064 B1 | 4/2001 | Lee | |
| 6,310,367 B1 * | 10/2001 | Yagishita et al. | 257/190 |
| 6,756,262 B1 * | 6/2004 | Nakamura et al. | 438/240 |
| 2001/0003364 A1 | 6/2001 | Sugawara et al. | |
| 2001/0023133 A1 * | 9/2001 | Hoke et al. | 438/738 |
| 2001/0023134 A1 * | 9/2001 | Akatsu et al. | 438/745 |
| 2002/0048972 A1 * | 4/2002 | Yamaguchi et al. | 438/926 |
| 2004/0029323 A1 * | 2/2004 | Shimizu et al. | 438/142 |
| 2004/0075148 A1 * | 4/2004 | Kumagai et al. | 257/369 |
| 2004/0084735 A1 * | 5/2004 | Murthy et al. | 257/408 |
| 2005/0077511 A1 * | 4/2005 | Fitzergald | 257/19 |

FOREIGN PATENT DOCUMENTS

| | | |
|---|---|---|
| JP | 11-54756 | 2/1999 |
| JP | 2000-36567 | 2/2000 |
| JP | 2001-28341 | 1/2001 |

OTHER PUBLICATIONS

G. Scott et al., "NMOS Drive Current Reduction Caused by Transistor Layout and Trench Isolation Induced Stress", International electron Devices Meeting 1999, IEDM Technical Digest, 1999, pp. 827-830.

International Search Report dated Mar. 25, 2003.

* cited by examiner

MOS SEMICONDUCTOR DEVICE

TECHNICAL FIELD

The present invention relates to a MOS semiconductor device having a MOS field effect transistor, and more particularly to a MOS semiconductor device including at least one of a p-channel MOS field effect transistor and an n-channel MOS field effect transistor which are improved in ON-current.

BACKGROUND ART

Improvements in performances of MOS transistors and CMOS have been made by shrinkage or scaling down thereof, for example, shortening a channel length and a reduction in thickness of a gate insulating film. A reduction in thickness of the gate insulating film and a minimum size or dimension for process have become closer to the limitations. A further improvement in performance can not depend upon the limited shrinkage or scaling down of the device, but should depend upon any other measures than the shrinkage or scaling down of the device.

One of the improvements in performance of the device is a technique of applying a stress to a channel region for improving a carrier mobility, so called strained-Si channel technique. The followings are the technique for forming a device in an strained Si wide region. A first conventional method is that an Si epitaxial growth over a single crystal SiGe relaxed layer is made, so that an MOS is formed in the Si epitaxial layer. A second conventional method is that an extremely thin SOI is heated at a high temperature and then cooled to room temperature, and in this cooling process, a strain is generated in the SOI. This strain is utilized.

The first conventional method has problems for how to keep a surface planarity of Si layer grown over the relaxed layer as well as how to reduce defects in the related layer or the strained Si layer. The first conventional method is not practically realizable. In accordance with the first conventional method, a strain of at most 0.3 GPa can be introduced, thereby making it difficult to obtain a sufficiently high mobility.

Different from the technique for introducing the uniform strain into the wide area of the substrate, another technique is present for controlling a lattice strain of a channel or a mobility of carriers by utilizing a stress caused by the device structure or process, particularly a device isolation technique. Japanese laid-open patent publication No. 2001-28341 discloses that an Si layer is deposited by a sputtering method over an $SiO_2$ layer, which may be compressible and is deposited over an Si substrate. Then, the Si layer is made into an Si island for subsequent heat treatment to cause a compression of the $SiO_2$ film and a crystallization of the Si film, whereby a compressive strain is introduced into a p-channel MOS field effect transistor. Even the heat treatment is made to the Si film deposited over the amorphous $SiO_2$ film, then the Si film is not crystallized. The compressive strain as introduced provides a mobility of polycrystalline. This is unsuitable for the cases that the MOS transistor or the CMOS is formed over the single crystal Si.

Japanese laid-open patent publication No. 2000-36567 discloses that a thickness of an oxide film buried in an SOI wafer and a condition for forming a field oxide film for forming an island of the Si film over the SOI wafer are properly set to allow the Si island to accept the compressive stress. A gate delay time of the p-channel MOS field effect transistor in accordance with this method is smaller than that of the p-channel MOS field effect transistor formed over a bulk Si substrate. An increase in a mobility of holes is confirmed. Since the strain introduced into the island is the compressive strain, the increase in the mobility is the opposite effect to the n-channel MOS field effect transistor. For this reason, it is not anticipated to improve the performance of CMOS.

Japanese laid-open patent publication No. 11-54756 discloses that each mobility of electron and hole in biaxial-compressive-and-tensile-strained Si are calculated to investigate what strain is effective to improve the performance of CMOS. As a result of the investigation, it was confirmed that the compressive strain of 1%–2% improves electron and hole mobilities. An Si island structure was proposed for realizing the strained Si, wherein the structure comprises an SOI isolated in LOCOS method. The strain of 1%–2% is to generate crystal defect and break Si crystal. Practical realization of this conventional method is difficult.

An issue of the present invention is to solve the above-described problems with the prior art.

An object of the present invention is to improve an ON-current of a p-channel MOS field effect transistor and an n-channel MOS field effect transistor for controlling a strain of a channel region, wherein a stress caused by a device structure is controlled by a method highly matched to the conventional process as well as to provide a CMOS comprising an n-channel MOS field effect transistor and a p-channel MOS field effect transistor which are improved in ON-current.

DISCLOSURE OF INVENTION

In order to achieve the above objects, the present invention provides an MOS semiconductor device having a p-channel MOS field effect transistor with a channel which has a compressive strain in a channel direction and a compressive strain in a gate width direction, wherein the compressive strain in the channel direction is larger than the compressive strain in the gate width direction.

It is preferable that the p-channel MOS field effect transistor has a gate electrode which has a gate length of not less than 0.2 micrometers and has a source/drain length of less than 1 micrometer.

In order to achieve the above objects, the present invention provides a semiconductor device including a p-channel MOS transistor isolated by a device isolation film buried in a trench groove, and at least a part of the device isolation film, which is adjacent to parallel two sides, in parallel to a gate width direction, of source/drain regions of the p-channel MOS field effect transistor, comprises a silicon oxide film, and at least a part of the device isolation film, which is adjacent to parallel two sides, in parallel to a channel direction, of the source/drain regions of the p-channel MOS field effect transistor, comprises a silicon nitride film.

It is preferable that an n-channel MOS field effect transistor is formed over a substrate, over which the p-channel MOS field effect transistor is formed.

In order to achieve the above objects, the present invention provides a semiconductor device including an n-channel MOS field effect transistor with a channel region which has a tensile strain in a channel direction or a gate width direction and another compressive strain in the gate width direction or the channel direction, wherein the tensile strain in the channel direction or the gate width direction is larger than the other tensile strain in the gate width direction or the channel direction.

In order to achieve the above objects, the present invention provides a MOS semiconductor device having an n-channel MOS field effect transistor isolated by a device isolation film buried in a trench groove, and at least a part of the device isolation film adjacent to at least parallel two sides of source/drain regions of the n-channel MOS field effect transistor comprises a silicon nitride film.

BRIEF DESCRIPTIONS OF DRAWINGS

THE BEST MODE FOR CARRYING OUT THE INVENTION

The embodiments of the present invention will be described in details with reference to the drawings.

[First Embodiment]

Figure 1:
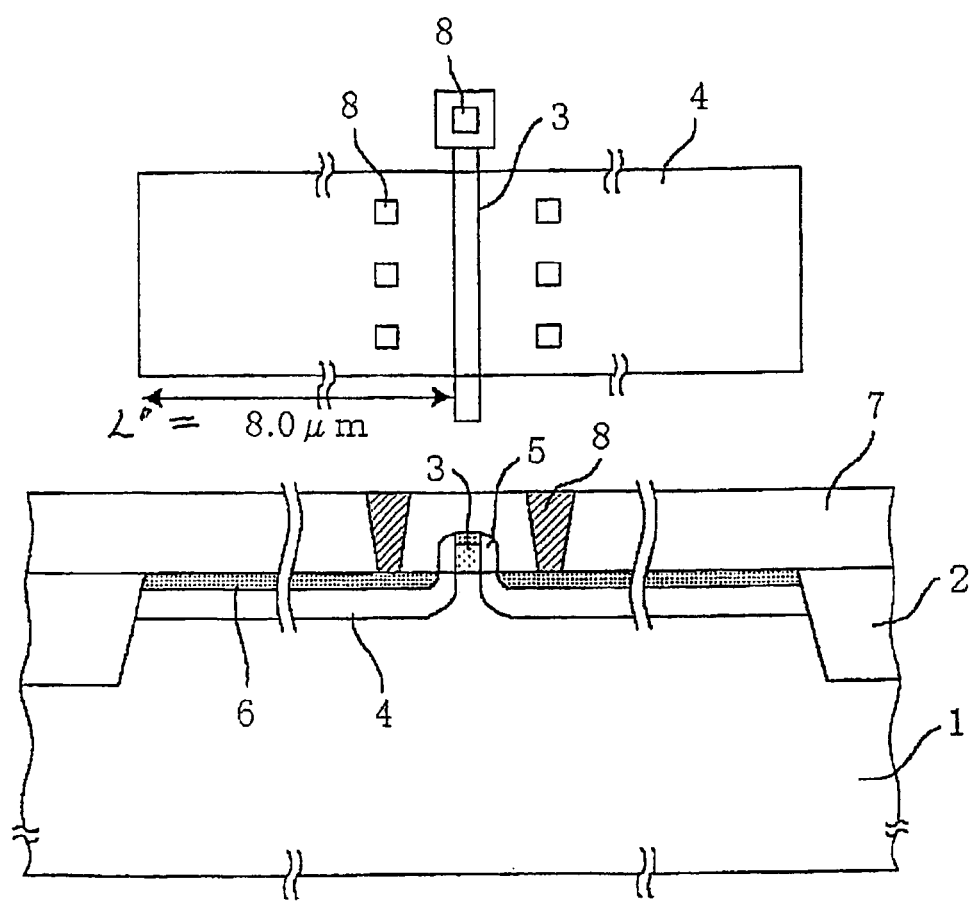
FIG. 1 is a schematic view of a p-channel MOS field effect transistor with a long source/drain length for investigation on a relationship between a lattice strain and an ON-current in a channel region thereof in a first embodiment of the present invention.
Figure 2:
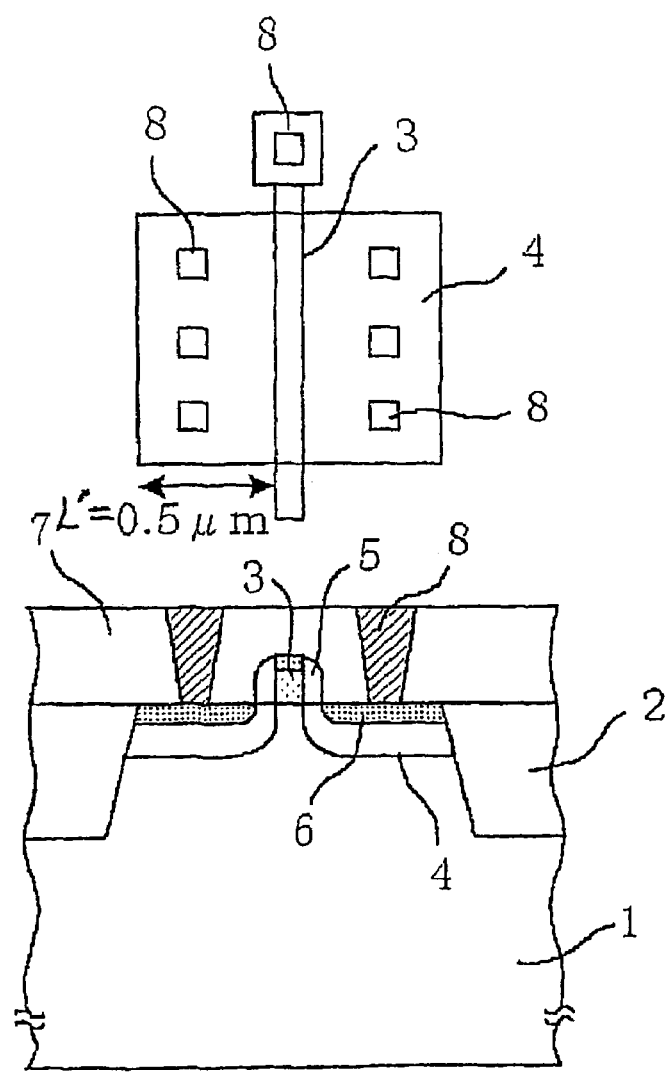
FIG. 2 is a schematic view of a p-channel MOS field effect transistor with a short source/drain length for investigation on a relationship between a lattice strain and an ON-current in a channel region thereof in a first embodiment of the present invention.

The present inventors investigated a channel region with a strain introduced by an STI (shallow trench isolation)-type device isolation region as well as an influence of this strain to an ON-current. For this purpose, two p-channel MOS field effect transistors were prepared and measured in lattice strain of channel region and in ON-current, wherein the two p-channel MOS field effect transistors are different in a distance L' between the device isolation film and the channel or source/drain length as shown in FIGS. 1 and 2. FIG. 1 shows a first p-channel MOS field effect transistor with a long source/drain length. FIG. 2 shows a second p-channel MOS field effect transistor with a short source/drain length.

As shown in FIG. 1, the first p-channel MOS field effect transistor has the following structure. An active region is isolated by an STI (shallow trench isolation)-type device isolation film 2 over a silicon substrate 1. A gate insulation film (not illustrated) is formed over the active region. A gate electrode 3 is formed over the gate insulation film. The gate electrode 3 has a gate length of 0.11 micrometers and comprises a polysilicon. Source/drain regions comprising diffusion layers 4 are formed by using the gate electrode 3 as a mask. Each of the source/drain regions has a source/drain length L' of 8.0 micrometers. Side walls 5 are formed on side walls of the gate electrode. A cobalt silicide film 6 is formed on surfaces of the diffusion layers 4 forming the source/drain regions and the gate electrode 3, and the cobalt silicide film 6 is self-aligned to the side walls 5. An inter-layer insulator 7 coats a substrate surface. Contact holes are formed in the inter-layer insulator 7, wherein the contact holes are positioned over the diffusion layers 4 and the gate electrode top. Contact plugs 8 burying the contact holes are formed, thereby forming the first p-channel MOS field effect transistor.

As shown in FIG. 2, the second p-channel MOS field effect transistor has the following structure. An active region is isolated by an STI (shallow trench isolation)-type device isolation film 2 over a silicon substrate 1. A gate insulation film (not illustrated) is formed over the active region. A gate electrode 3 is formed over the gate insulation film. The gate electrode 3 has a gate length of 0.11 micrometers and comprises a polysilicon. Source/drain regions comprising diffusion layers 4 are formed by using the gate electrode 3 as a mask. Each of the source/drain regions has a source/drain length L' of 0.5 micrometers. Side walls 5 are formed on side walls of the gate electrode. A cobalt silicide film 6 is formed on surfaces of the diffusion layers 4 forming the source/drain regions and the gate electrode 3, and the cobalt silicide film 6 is self-aligned to the side walls 5. An inter-layer insulator 7 coats a substrate surface. Contact holes are formed in the inter-layer insulator 7, wherein the contact holes are positioned over the diffusion layers 4 and the gate electrode top. Contact plugs 8 burying the contact holes are formed, thereby forming the second p-channel MOS field effect transistor. The second p-channel MOS field effect transistor is different in the source/drain length only from the first p-channel MOS field effect transistor.

Measurements of lattice strain of the channel region and the ON-current were then made to the first p-channel MOS field effect transistor and the second p-channel MOS field effect transistor.

The measurement of the lattice strain was made by using a convergent electron diffraction method utilizing a transmission electron microscope. In this method, a convergent electron beam with a diameter of not more than 1 nanometer is irradiated on the sample in order to obtain a diffraction image. Taking into account a dispersion of electrons, it is possible to measure a strain at a specified site of the sample at a spatial resolution of about 10 nm. Details of the measuring method and the analyzing method of the diffraction image are described in Japanese laid-open patent publication No. 2000-9664.

Figure 3:
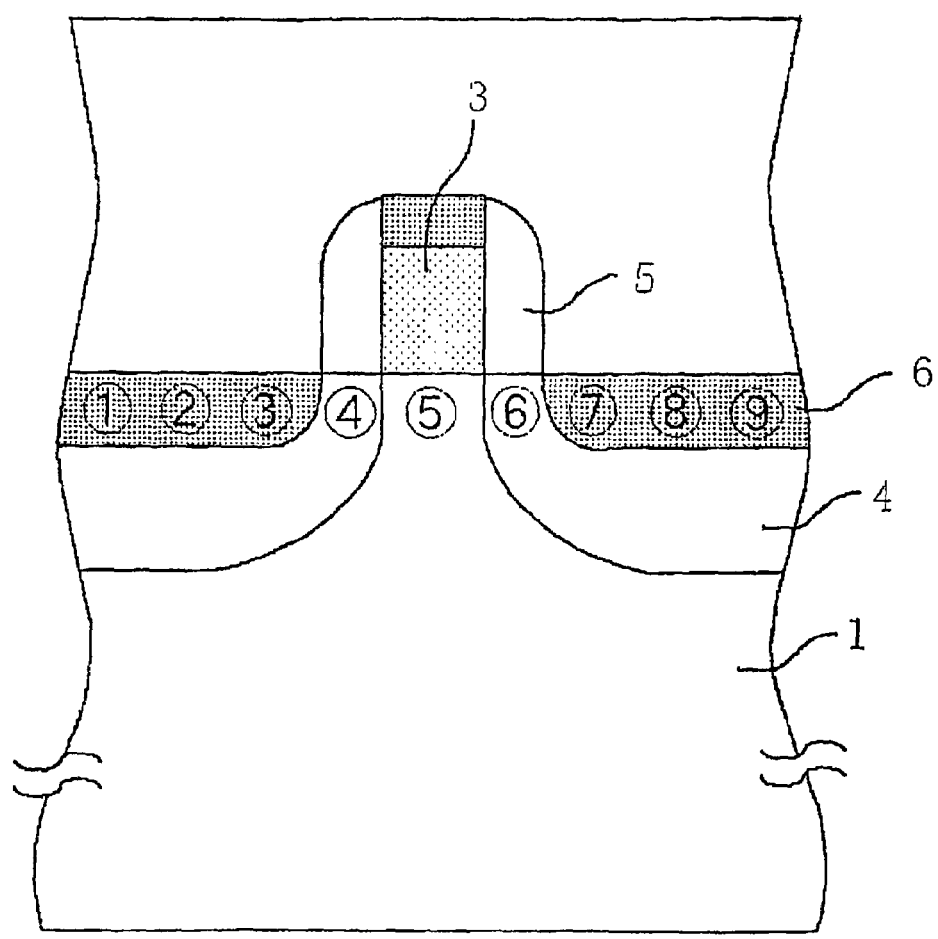
FIG. 3 is a view showing a measured position of a region, for which a lattice strain was measured.

FIG. 3 is a view showing a measuring position of a region, to which a lattice strain measurement was made. In each sample, lattice strain measurements were made at each numbered position. Respective distances of the measured positions from Si surface or respective depths from the substrate surface are uniform at about 10 nm.

Figure 4:
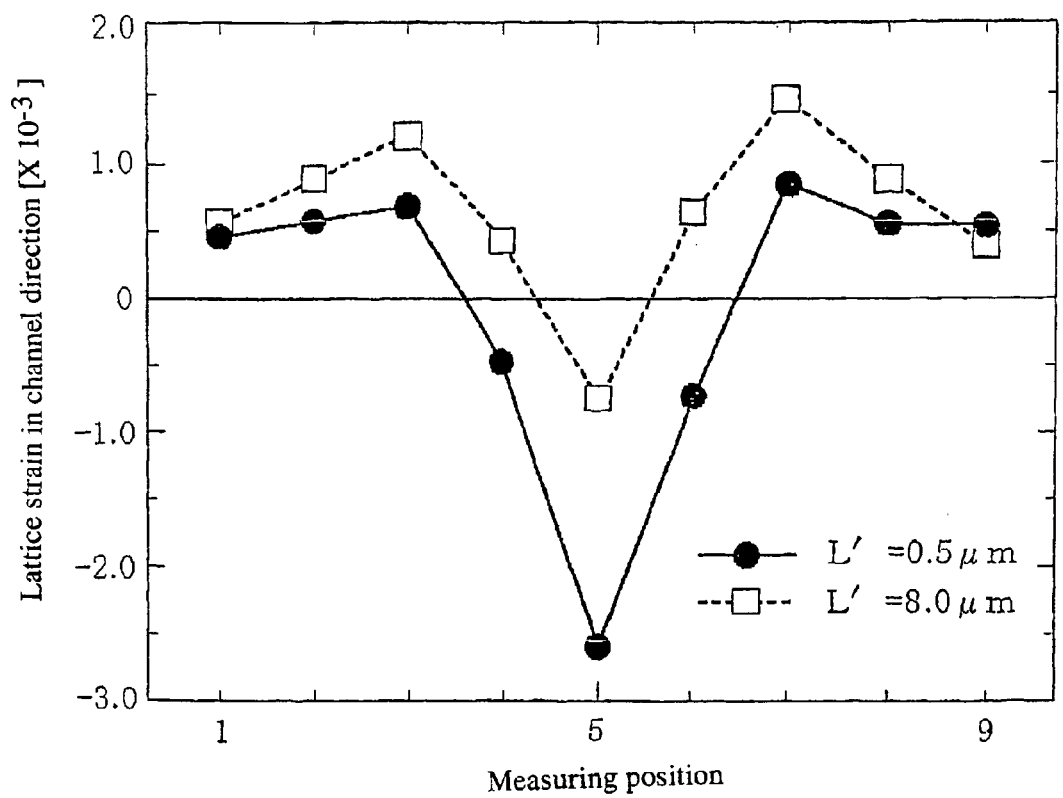
FIG. 4 is a view showing a distribution of a lattice strain in a channel direction in samples of two source and drain lengths.

FIG. 4 shows a distribution of lattice strain in a channel direction of each of the first p-channel MOS field effect transistor of L'=8 micrometers and the second p-channel MOS field effect transistor of L'=0.5 micrometers. The channel direction is a direction along which carriers travel, and corresponds to a gate length direction. A direction perpendicular to the channel direction corresponds to the gate width direction. In FIG. 4, a horizontal axis corresponds to numbers of measuring positions in FIG. 3, wherein a measuring point 5 corresponds to a channel region directly under the gate electrode. A vertical axis represents a lattice strain, wherein a positive direction of the vertical axis represents a tensile stress, while a negative direction of the vertical axis represents a compressive stress.

A comparison of a value at a measuring point 5 directly under the gate electrode is made. The first p-channel MOS field effect transistor of L'=8 micrometers has a lattice strain in a channel direction of $-7 \times 10^{-4}$ at a measuring point 5 directly under the gate electrode. In contrast, the second p-channel MOS field effect transistor of L'=0.5 micrometers has a lattice strain in a channel direction of $-2.6 \times 10^{-3}$ at a measuring point 5 directly under the gate electrode. The first and second p-channel MOS field effect transistors have compressive strains of lattice at the measuring point 5 directly under the gate electrode. It is demonstrated that as the source/drain length L' is decreased, then the absolute value of this compressive strain is increased, and also that as the source/drain length L' is increased, then the absolute value of this compressive strain is decreased. This cause is that the diffusion layer 4 forming the source/drain defined by the trench device isolation film receives the compressive strain which is increased by decrease of the source/drain length L'. Adjustment to the source/drain length L' may adjust the lattice strain caused by the channel region.

Figure 5:
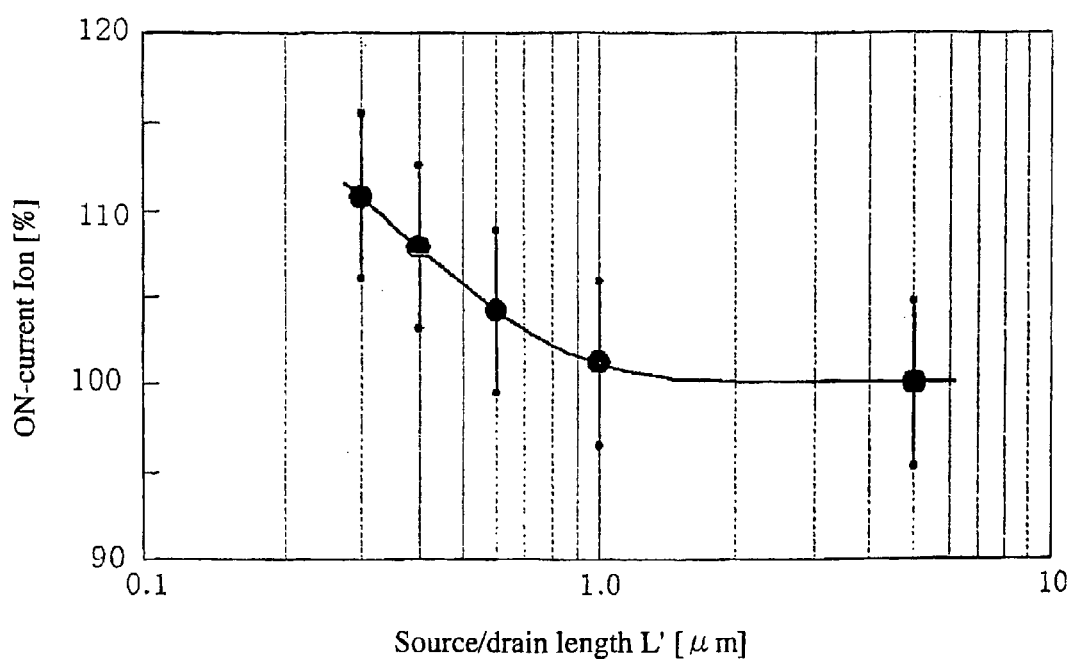
FIG. 5 is a graph showing a dependency of ON-current upon a source/drain length in a p-channel MOS field effect transistor.

FIG. 5 shows a dependency of ON-current upon the source/drain length L' of the p-channel MOS field effect transistor. If the source/drain length L' is ranged from 1.0 micrometer to 10 micrometers, then almost no variation in ON-current is caused. If the source/drain length L' is less than 1 micrometer, then an increase in the ON-current is caused upon decrease of the source/drain length L'. The ON-current at L'=0.3 micrometers is higher by about 10% than the ON-current at L'=5.0 micrometers. The above experimental result shows that the decrease of the source/drain length L' increases the compressive strain of the lattice structure of the channel region. The increase in the compressive strain causes the increase of the hole mobility to increase the ON-current.

In accordance with the present embodiment, no measurement is made to a strain in a gate width direction or a vertical direction to a paper of FIG. 3. Notwithstanding, the device isolation film is present in this direction in the actual device, for which reason a compressive strain is also present unless any particular relaxation process is made. The presence of the gate electrode over the active region of the p-channel MOS field effect transistor does not generate any isotropic strain and also does not generate any compressive strain in the gate width direction as large as the compressive strain in the channel direction. As the source/drain length L' becomes shorter, then the compressive strain of the lattice structure in the channel direction becomes dominant over the compressive strain of the lattice structure in the gate width direction. Shortening the source/drain length L' to less than 1 micrometer introduces the compressive strain in the channel direction which is larger than the compressive strain in the gate width direction.

The source/drain length of the second p-channel MOS field effect transistor shown in FIG. 2 is shorter than 1 micrometer, for example, L'=0.5 micrometers. Namely, in the second p-channel MOS field effect transistor, the compressive strain in the channel direction is larger than and dominant over the compressive strain in the gate width direction.

The compressive strain of $-2.6 \times 10^{-3}$ in the channel direction at L'=0.5 micrometers is as large as any crystal defect may theoretically be generated. In accordance with this embodiment, such large strain is generated in an extremely limited area directly under the gate electrode, wherein no crystal defect is generated in such the limited area. For example, the gate length of the first and second p-channel MOS field effect transistors is 0.11 micrometers. The large strain is present only in such the local area, whereby no crystal defects are generated. In accordance with the present embodiment, the gate length is 0.11 micrometers as one example. Notwithstanding, if the gate length is not more than 0.2 micrometers, no crystal defect is generated.

It is, therefore, preferable that the gate length of the transistor of the present embodiment is not more than 0.2 micrometers.

The p-channel MOS field effect transistor in accordance with this embodiment allows adjustments to the compressive strain in the gate width direction and the compressive strain in the channel direction of the lattice structure of the channel region by only adjustment to the source/drain length in design process without changing to the manufacturing processes.

[Second Embodiment]

In accordance with the above-described first embodiment, the p-channel MOS field effect transistor is improved in ON-current by applying the compressive strain in the channel direction to the p-channel MOS field effect transistor. Application of the compressive strain in the channel direction to the n-channel MOS field effect transistor causes decrease of the ON-current. It is necessary for the n-channel MOS field effect transistor to introduce a tensile strain in the channel direction into the n-channel MOS field effect transistor to improve the ON-current thereof.

Figure 6:
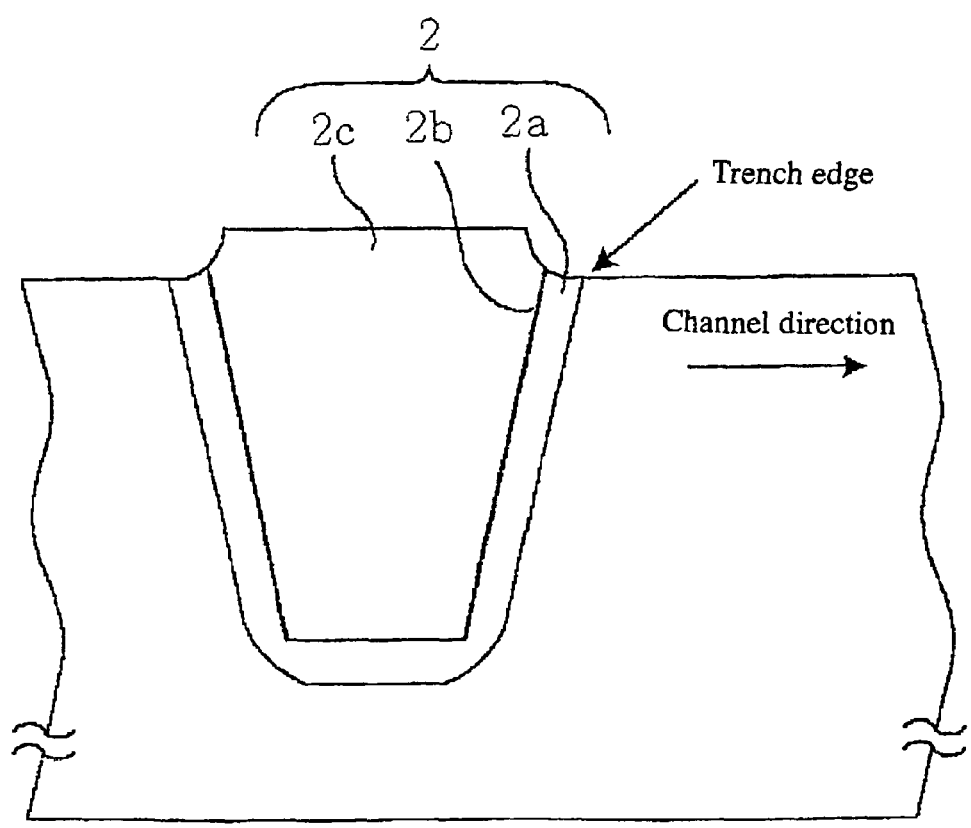
FIG. 6 is a schematic view showing a sectioned structure of an STI-type device isolation film with an inserted silicon nitride film in a second embodiment of the present invention.

In accordance with this second embodiment, a silicon nitride film is inserted into the STI-type device isolation film to introduce the tensile strain in the channel direction into the n-channel MOS field effect transistor to improve the ON-current thereof. FIG. 6 shows schematically the section of the device isolation film with the inserted silicon nitride film. The STI-type device isolation comprises a silicon oxide film 2a adjacent to an internal wall of a trench groove, a silicon oxide film 2c burying the trench groove, a silicon nitride film 2b interposed between the silicon oxide film 2a and the silicon oxide film 2c.

Figure 7:
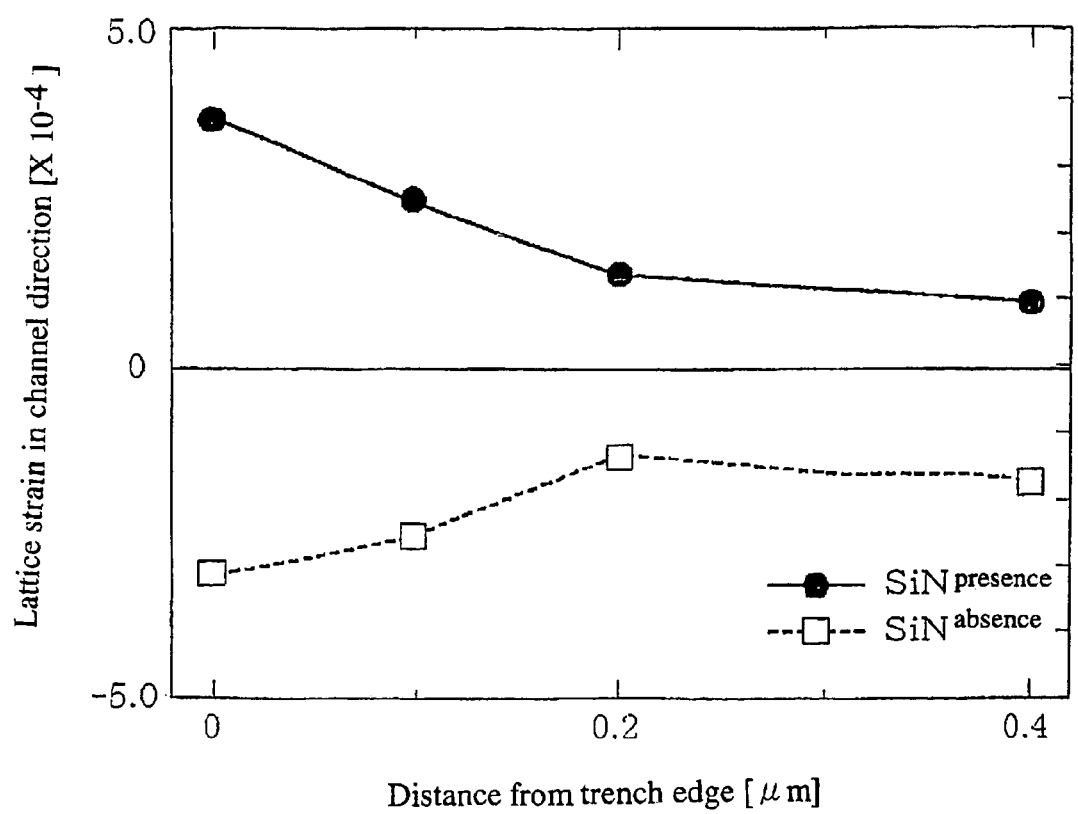
FIG. 7 is a view showing a distribution of a lattice strain in a channel direction of an STI-type device isolation film with an inserted silicon nitride film and another STI-type device isolation film free of any silicon nitride film in a second embodiment of the present invention.

FIG. 7 shows a measured result of a distribution of the lattice strain in the diffusion layer (as represented by broken line) in one case that the STI-type device isolation structure is free of any inserted silicon nitride film as well as another measured result of another distribution of the lattice strain in the diffusion layer (as represented by real line) in other case that the STI-type device isolation structure with the inserted silicon nitride film. A horizontal axis represents a distance from an edge of the trench of FIG. 6. If the silicon nitride film is not inserted, the compressive strain in the channel direction is present. In contrast, if the silicon nitride film is inserted, the tensile strain in the channel direction is present. This tensile strain is caused by a lateral strain to an intrinsic stress of the silicon nitride film.

The structure of the sample and the lattice strain are different between the case that the silicon nitride film of FIG. 7 is not inserted and the other case of L'=0.5 micrometers in FIG. 4. Namely, in FIG. 4. The measurement is made to the sample of the device structure having the MOS field effect transistor including the gate electrode. In FIG. 7, the measurement is made to the sample of the device structure having only the device isolation region, for which reason the distribution of the lattice strain is different between both cases. The results shown in FIGS. 4 and 7 are not inconsistent to each other.

Figure 8:
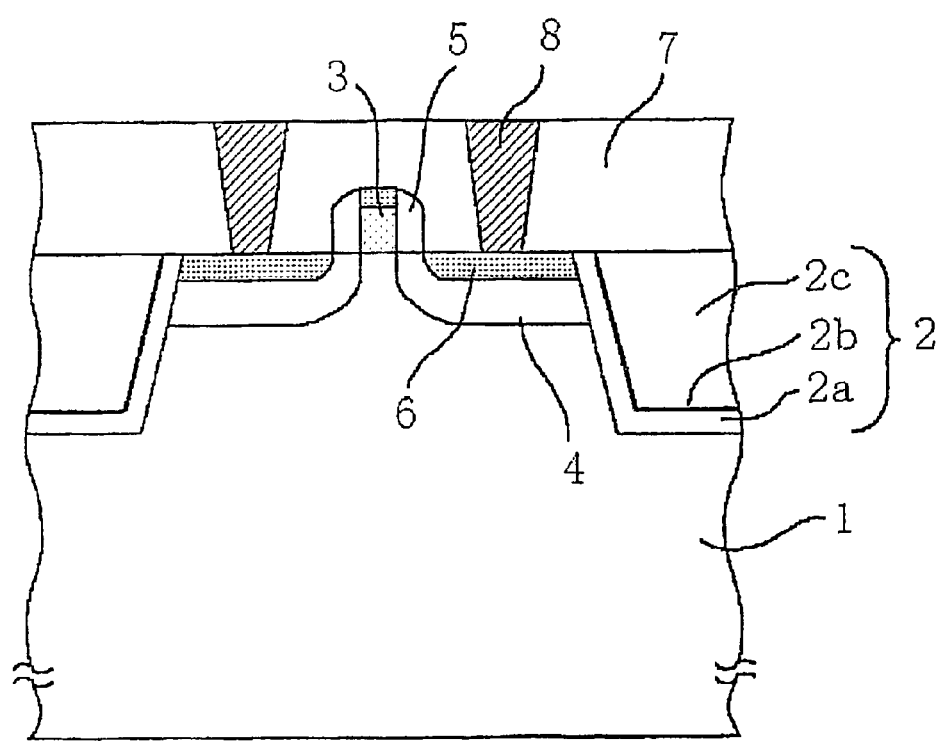
FIG. 8 is a sectioned view of an n-channel MOS field effect transistor with an inserted silicon nitride film in a second embodiment of the present invention.

FIG. 8 is a cross sectioned view of the n-channel MOS field effect transistor in accordance with the second embodiment of the present invention. In FIG. 8, the same reference numbers are allocated to the same parts as in FIG. 1. Duplicate descriptions will be omitted. In accordance with this embodiment, the device isolation film has a triple-layered structure of a silicon oxide film 2a, a silicon nitride film 2b and a silicon oxide film 2c. This structure generates a tensile strain in the channel direction which is larger than another tensile strain in the gate width direction, thereby to improve the ON-current as compared to the n-channel MOS field effect transistor isolated by the device isolation film free of any inserted silicon nitride film.

The insertion of the silicon nitride film into the device isolation film is achieved by that a part of the device isolation film comprises the silicon nitride film. A variety of modification thereto may be available. It is, for example, possible that the entirety of the trench groove is buried with silicon nitride. Taking into account increasing an interface state density with the silicon substrate, it is preferable that the inner surface comprises the silicon oxide film. The quantity of the tensile strain depends upon the thickness of the silicon nitride film. It is preferable to select the structure of the device isolation film and the thickness of the silicon nitride film based on the quantity of the strain to be introduced.

In accordance with the present embodiment, the silicon nitride film is inserted into the device isolation film with the section parallel to a paper of the drawing. Notwithstanding, it is also possible to insert the silicon nitride film into the device isolation film with the section vertical to a paper of the drawing.

The preferable gate length is as mentioned in the first embodiment.

The p-channel MOS field effect transistor in accordance with this embodiment allows adjustments to the compressive strain in the gate width direction and the compressive strain in the channel direction of the lattice structure of the channel region by only adjustment to the source/drain length in design process without changing to the manufacturing processes.

[Third Embodiment]

Figure 9:
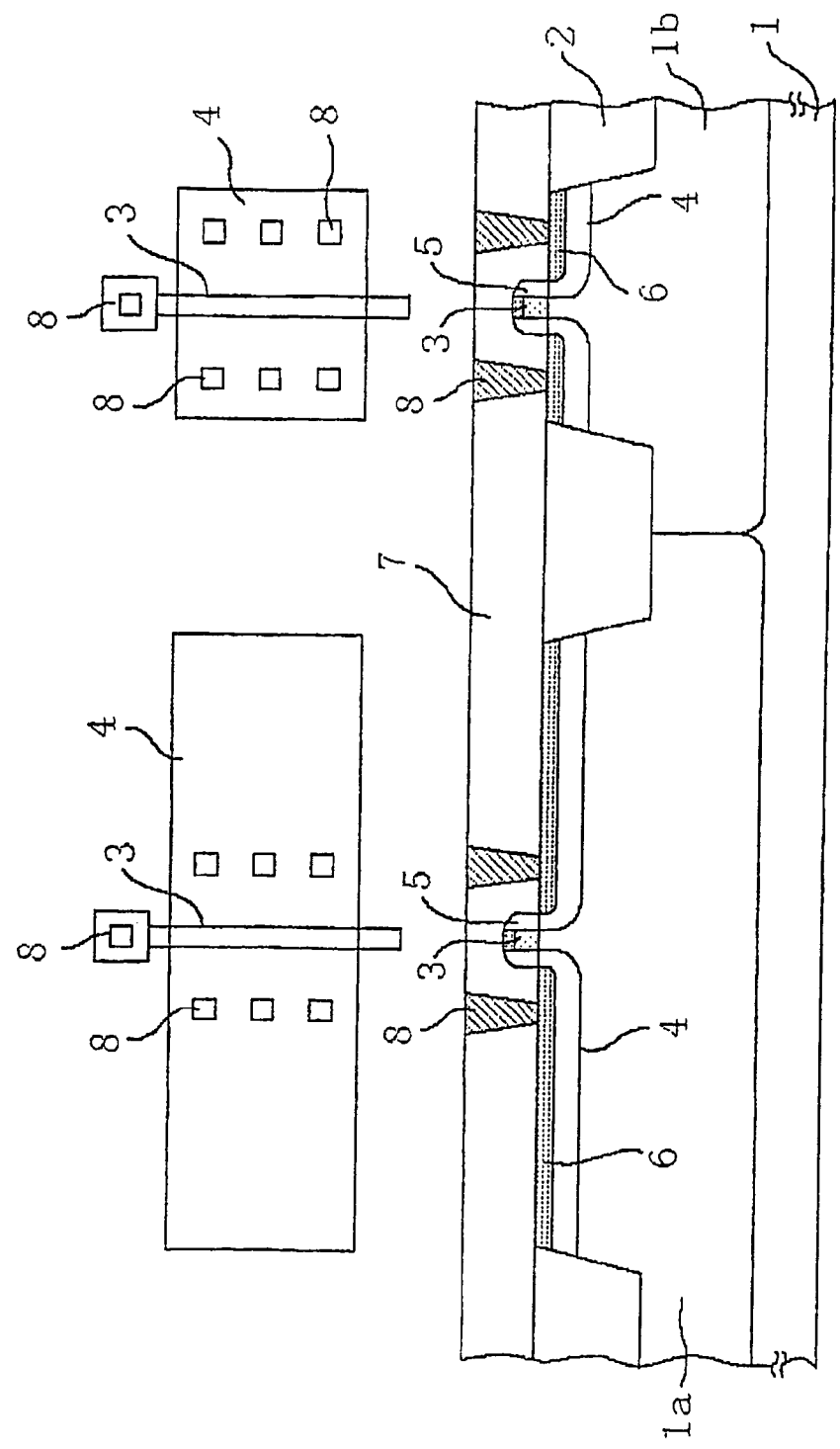
FIG. 9 is a sectioned view of a CMOS improved in performance by an improved ON-current of a p-channel MOS field effect transistor in a third embodiment of the present invention.

FIG. 9 is fragmentary plan and sectional views showing a CMOS structure in accordance with the third embodiment of the present invention. in FIG. 9, the same reference numbers are allocated to the same parts as shown in FIGS. 1 and 2. Duplicate descriptions will be omitted. In the third embodiment shown in FIG. 9, a p-well 1a and an n-well 1b are formed over a silicon substrate 1. An n-channel MOS field effect transistor and a p-channel MOS field effect transistor are formed over those wells. As shown in the same drawing, in accordance with this embodiment, the CMOS structure comprises the n-channel MOS field effect transistor with a long source/drain length L' and the p-channel MOS field effect transistor with a short source/drain length L'. If the source/drain length L' is short, then the hole mobility is increased, while the electron mobility is decreased. If both the n-channel and p-channel MOS field effect transistors have short source/drain length, then the n-channel MOS field effect transistor is deteriorated in performance, whereby any improvement in performance of the CMOS device can be expected. Therefore, the source/drain length of the n-channel MOS field effect transistor is increased to avoid any drop of the electron mobility by the compressive strain. It is preferable that the source/drain length is not less than 1 micrometer for avoiding any influence of the compressive strain. On the other hand, the source/drain length of the p-channel MOS field effect transistor is shorter than 1 micrometer, and typically L'=0.5 micrometers as mentioned above in the first embodiment. In the p-channel MOS field effect transistor, the compressive strain in the channel direction is larger than and dominant over the compressive strain in the gate width direction. The CMOS is so designed that the source/drain length of the n-channel MOS field effect transistor is longer than the source/drain length of the p-channel MOS field effect transistor.

The preferable gate length is as mentioned in the first embodiment.

Each of the p-channel and n-channel MOS field effect transistors in accordance with this embodiment allows adjustments to the compressive strain in the gate width direction and the compressive strain in the channel direction of the lattice structure of the channel region by only adjustment to the source/drain length in design process without changing to the manufacturing processes.

[Fourth Embodiment]

Figure 10:
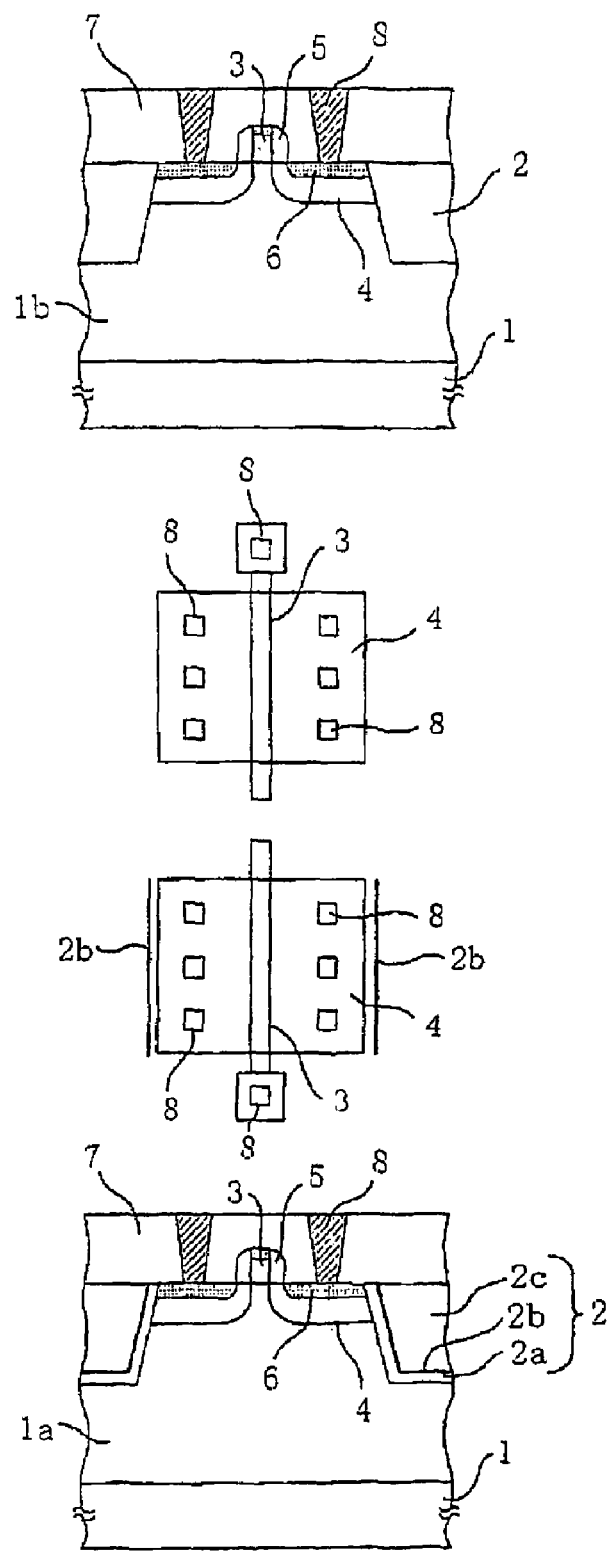
FIG. 10 is a sectioned view of a CMOS improved in performance by both improved ON-currents of n-channel and p-channel MOS field effect transistors in a fourth embodiment of the present invention.

FIG. 10 is fragmentary plan and sectional views showing a CMOS structure in accordance with the fourth embodiment of the present invention. In FIG. 10, the same reference numbers are allocated to the same parts as shown in FIGS. 8 and 9. Duplicate descriptions will be omitted. In the fourth embodiment, a CMOS structure comprises the n-channel MOS field effect transistor and the p-channel MOS field effect transistor. The p-channel MOS field effect transistor is isolated by the normal STI film, and the source/drain length is designed to be not more than 1 micrometer. In the n-channel MOS field effect transistor, a face of the source/drain region parallel to the gate width direction is adjacent to the STI film with the inserted silicon nitride film. In the channel region of the p-channel MOS field effect transistor, the compressive strain in the channel direction is larger than the compressive direction in the gate width direction. In the channel region of the n-channel MOS field effect transistor, the tensile strain in the channel direction is larger than the tensile direction in the gate width direction. In both the p-channel and n-channel MOS field effect transistors, it is possible to improve the ON-current and realize the high performance of CMOS. For the device isolation film of the n-channel MOS field effect transistor, it is possible that the silicon nitride films are inserted into all of the STI film adjacent to the source/drain regions of the n-channel MOS field effect transistor.

The preferable gate length is as mentioned in the first embodiment.

The p-channel MOS field effect transistor in accordance with this embodiment allows adjustments to the compressive strain in the gate width direction and the compressive strain in the channel direction of the lattice structure of the channel region by only adjustment to the source/drain length in design process without changing to the manufacturing processes. The n-channel MOS field effect transistor in accordance with this embodiment allows adjustments to the tensile strain in the gate width direction and the tensile strain in the channel direction of the lattice structure of the channel region by only adjustment to the source/drain length in design process without changing to the manufacturing processes.

[Fifth Embodiment]

In accordance with the above-described four embodiments, the strain in the channel direction is taken into account and is adjusted to improve the device performance. It has been known that another strain in a direction perpendicular to the channel direction or in the gate width direction changes the hole mobility. A. Hamada et al., "A New Aspect Of Mechanical Stress Effect SiN Scaled MOS Devices" IEEE Transactions on Electron Devices, 38 (1991) 895 discloses that application of the tensile stress of uniaxial stress in the perpendicular direction to the channel direction increases both electron mobility and hole mobility, while application of the compressive stress of uniaxial stress in the perpendicular direction to the channel direction decreases both electron mobility and hole mobility.

Figure 11:
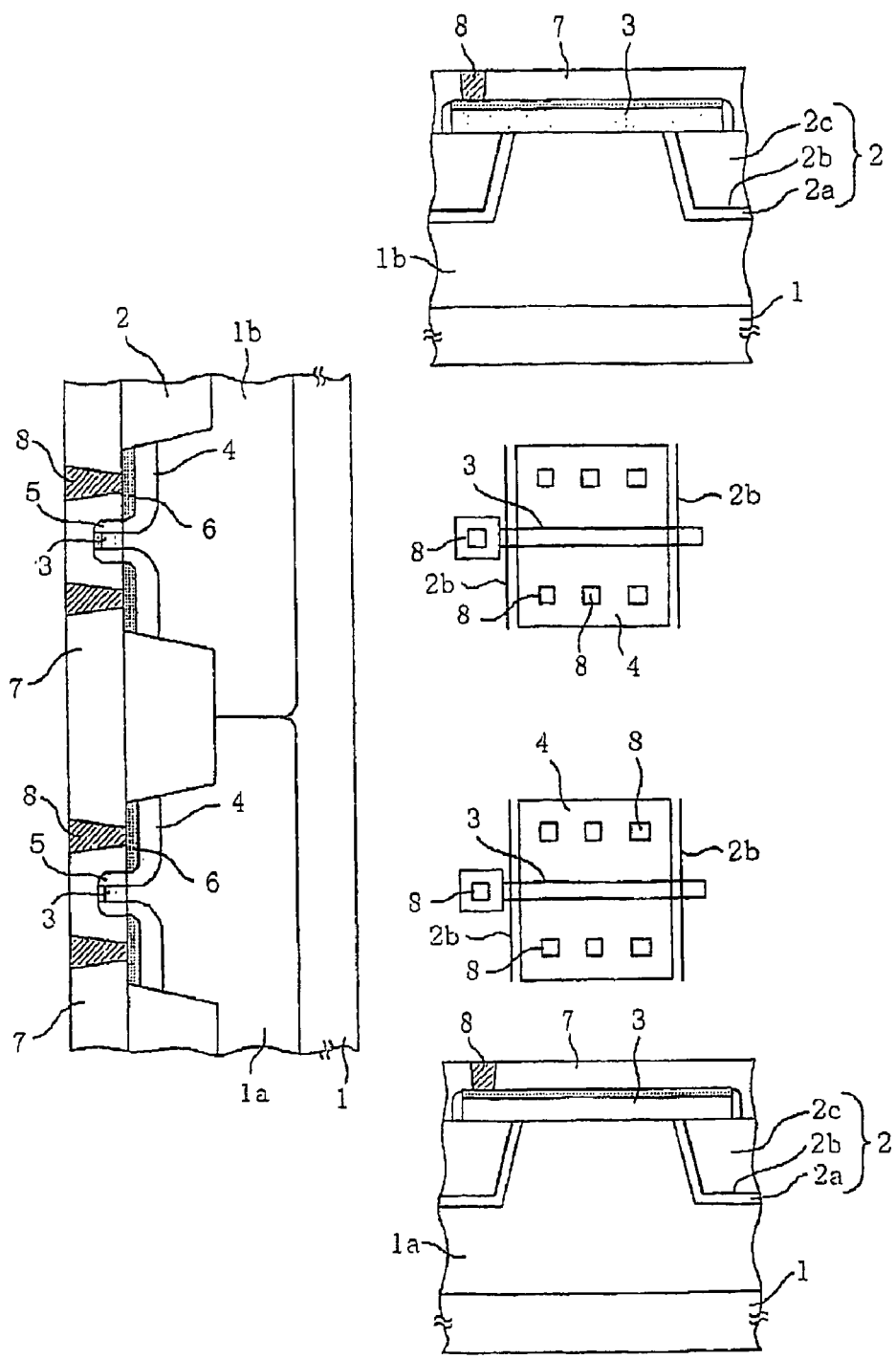
FIG. 11 is a sectioned view of a CMOS improved in performance by both improved ON-currents of n-channel and p-channel MOS field effect transistors in a fifth embodiment of the present invention.

FIG. 11 are fragmentary plan and sectional views showing CMOS structure in accordance with the fifth embodiment of the present invention. In FIG. 11, the same reference numbers are allocated to the same parts as shown in FIGS. 8 and 9. Duplicate descriptions will be omitted. In the fifth embodiment, a CMOS structure comprises the n-channel MOS field effect transistor and the p-channel MOS field effect transistor. In the p-channel MOS field effect transistor, a face of the source/drain region parallel to the channel direction is adjacent to the STI film with the inserted silicon nitride film. In the n-channel MOS field effect transistor, a face of the source/drain region parallel to the channel direction is also adjacent to the STI film with the inserted silicon nitride film. In accordance with this structure, the channel regions of both the p-channel and n-channel MOS field effect transistors receive application of the tensile strain in the gate width direction perpendicular to the channel region, thereby improving electron mobility and hole mobility.

The preferable gate length is as mentioned in the first embodiment.

Each of the p-channel and n-channel MOS field effect transistors is so designed that a face of the source/drain region parallel to the channel direction is adjacent to the STI film with the inserted silicon nitride film, whereby applying the channel region with a tensile strain in the gate width direction perpendicular to the channel direction for improving the electorn mobility and the hole mobility.

[Sixth Embodiment]

Figure 12:
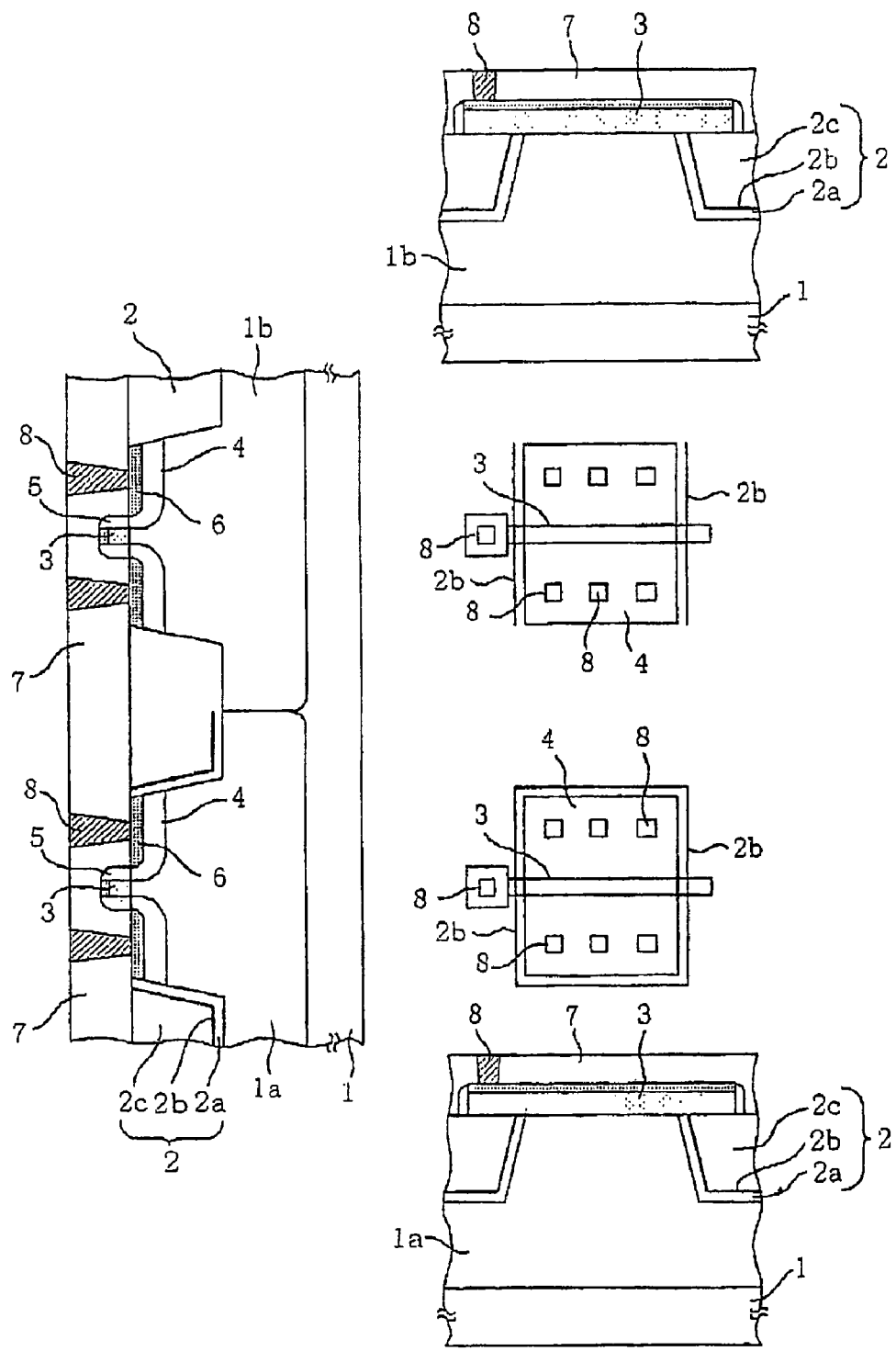
FIG. 12 is a sectioned view of a CMOS improved in performance by both improved ON-currents of n-channel and p-channel MOS field effect transistors in a sixth embodiment of the present invention.

FIG. 12 are fragmentary plan and sectional views showing CMOS structure in accordance with the sixth embodiment of the present invention. In FIG. 12, the same reference numbers are allocated to the same parts as shown in FIG. 11. Duplicate descriptions will be omitted. In the sixth embodiment, the source/drain length of the p-channel MOS field effect transistor is not more than 1 micrometer, and the n-channel MOS field effect transistor is isolated by the STI film with the inserted silicon nitride film which encompasses the n-channel MOS field effect transistor. This structure applies the compressive strain in the channel direction and the tensile strain in the gate width direction to the p-channel MOS field effect transistor to the p-channel MOS field effect transistor as well as applies the tensile strains in both the channel direction and the gate width direction to the n-channel MOS field effect transistor. This structure causes further improvements in the electron mobility and the hole mobility and also in the performance of the CMOS as compared to the fifth embodiment.

The preferable gate length is as mentioned in the first embodiment.

[Seventh Embodiment]

Figure 13:
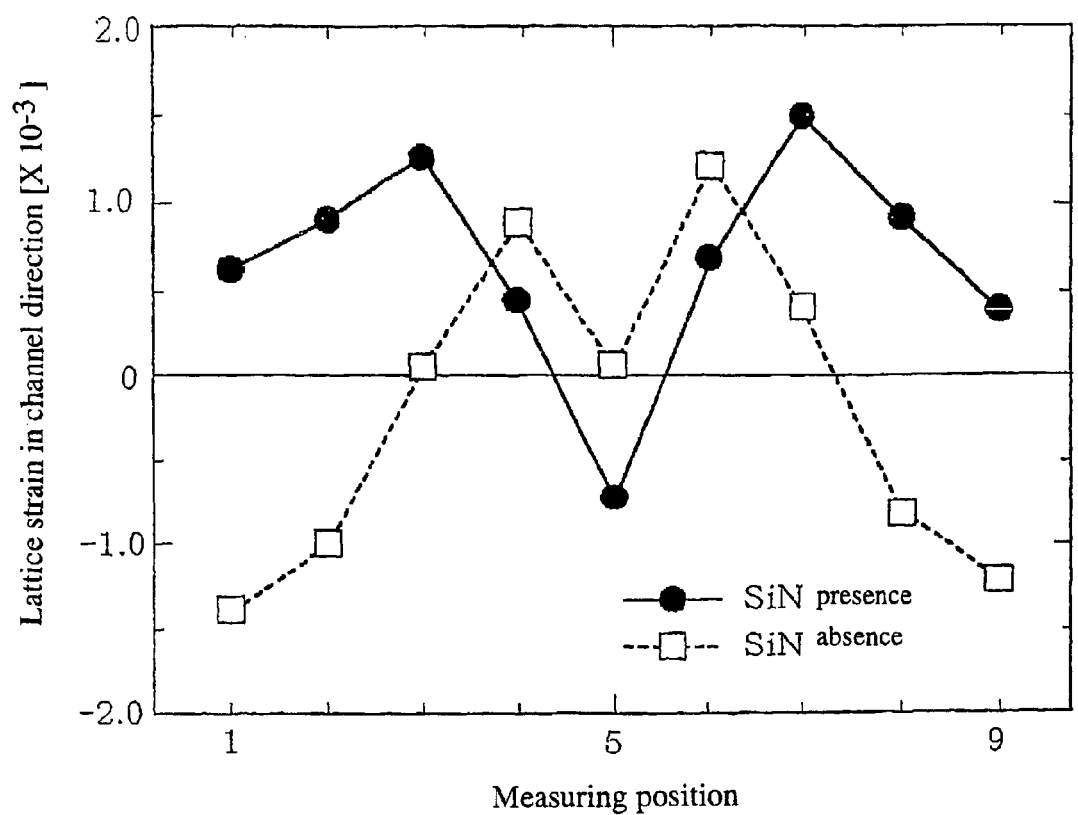
FIG. 13 is a view showing a distribution of a strain in a channel direction in the presence and absence of a silicon nitride film.
Figure 14:
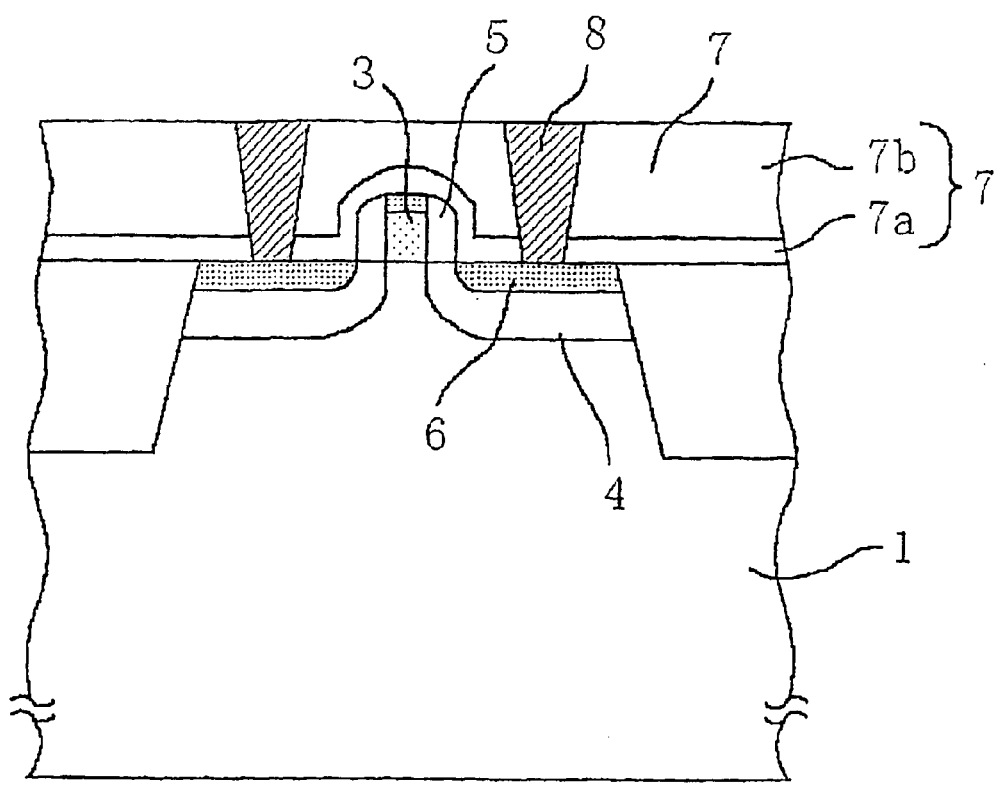
FIG. 14 is a schematic view of a p-channel MOS field effect transistor with a short source/drain length for investigation on a relationship between a lattice strain and an ON-current in a channel region thereof in a seventh embodiment of the present invention.

Utilization of a film stress at the top of the channel region is also available for applying a strain to the channel region. FIG. 13 shows a distribution of a strain in the channel direction in the presence and absence of the silicon nitride film. FIG. 14 is a schematic view showing a p-channel MOS field effect transistor with a short source/drain length prepared for investigation on a relationship between the lattice strain in the channel region and the ON-current. In FIG. 14, the same reference numbers are allocated to the same parts as shown in FIGS. 1 and 2. Duplicate descriptions will be omitted. In the seventh embodiment, an interlayer insulator comprises a silicon nitride film 7a as an etching stopper and a silicon oxide film 7b. In FIG. 13, the strains in the channel direction are shown in the presence and absence of the silicon nitride film 7b. Measuring positions correspond to numbers shown in FIG. 3. As can be seen from FIG. 13, the silicon nitride film covering the active region introduces the lattice strain in the channel direction into the channel region locally, whereby the hole mobility is improved, ad the high speed performance of the p-channel MOS field effect transistor is realized.

It is possible that the silicon nitride film 7b is so formed as covering the entirety of the substrate even the effect of improving the electron mobility can not be expected. For this reason, it is also possible to selectively remove the silicon nitride film from the position over the n-channel MOS field effect transistor. It is also possible to selectively form the silicon nitride film over the p-channel MOS field effect transistor. As coating materials, not only the silicon nitride film but also other materials causing a tensile strain in the Si substrate are also available. It should be noted that utilization of the film strain over the channel region causes application of one of the compressive and tensile strains. The present embodiment may also be applied in combination with the other embodiments.

INDUSTRIAL APPLICABILITY

As described above, in accordance with the MOS semiconductor device of the present invention, the source/drain length is adjusted or the nitride film is inserted in the isolation film in order to adjust the strain in the channel region. In accordance with the present invention, control to the strain in the channel region is made to increase the ON-currents of the p-channel and n-channel MOS field effect transistors. The p-channel and n-channel MOS field effect transistors are independently controllable in strain, thereby avoiding that increase of one ON-current causes decrease of another ON-current. In accordance with the present invention, however, it is possible to increase the ON-currents of the p-channel and n-channel MOS field effect transistors for realizing the high performance of the CMOS device without increasing a cost.

What is claimed is:

1. A semiconductor device including a p-channel MOS field effect transistor with a channel region which has a compressive strain in a channel direction and a compressive strain in a gate width direction,
   wherein the compressive strain in the channel direction is larger than the compressive strain in the gate width direction, and
   wherein the channel region of the p-channel MOS field effect transistor has a tensile stress in the gate width direction, and
   wherein the p-channel MOS field effect transistor comprises a source/drain length of less than 1 micrometer, the source/drain length comprising a distance from a gate electrode to a side of a source/drain region, and the side extends in a gate width direction, so that the compressive strain in the channel direction is larger than the compressive strain in the gate width direction.

2. The semiconductor device as claimed in claim 1, wherein the p-channel MOS field effect transistor comprises an active region having a compressive strain in the channel direction, and
   wherein the compressive strain in the channel direction is locally increased in the channel region.

3. The semiconductor device as claimed in claim 1, wherein the p-channel MOS field effect transistor comprises a gate electrode with a gate length of not more than 0.2 micrometers.

4. The semiconductor device as claimed in claim 1, further including a stress applying film over a semiconductor substrate, and the stress applying film applying a stress to the channel region.

5. The semiconductor device as claimed in claim 1, wherein the stress applying film comprises a silicon nitride film.

6. A semiconductor device including a p-channel MOS field effect transistor with a channel region which has a compressive strain in a channel direction and a compressive strain in a gate width direction,
   wherein the compressive strain in the channel direction is larger than the compressive strain in the gate width direction,
   wherein the channel region of the p-channel MOS field effect transistor has a tensile stress in the gate width direction, and
   wherein the semiconductor device further comprises an n-channel MOS field effect transistor formed over a substrate, over which the p-channel MOS field effect transistor is formed.

7. The semiconductor device as claimed in claim 6, wherein the n-channel MOS field effect transistor comprises a source/drain length of not more than 1 micrometer.

8. The semiconductor device as claimed in claim 6, wherein the n-channel MOS field effect transistor has a tensile stress in at least one of the channel direction and the gate width direction.

9. The semiconductor device as claimed in claim 6, wherein the n-channel MOS field effect transistor is isolated by a device isolation film buried in a trench groove, and the device isolation film is adjacent to at least parallel two sides of source/drain regions of the n-channel MOS field effect transistor, and at least a part of the device isolation film adjacent to the at least parallel two sides comprises a silicon nitride film.

10. The semiconductor device as claimed in claim 9, wherein the device isolation film having the at least pan comprising the silicon nitride film comprises an insulation film of a triple-layered structure of an oxide film, a nitride film and an oxide film.

11. The semiconductor device as claimed in claim 6, wherein a source/drain length of said n-channel MOS field effect transistor is greater than a source/drain length of said p-channel MOS field effect transistor.

12. A semiconductor device including a p-channel MOS transistor isolated by a device isolation film buried in a trench groove, and at least a part of the device isolation film, which is adjacent to parallel two sides, in parallel to a gate width direction, of source/drain regions of the p-channel MOS field effect transistor, comprising a silicon oxide film, and at least a part of the device isolation film, which is adjacent to parallel two sides, in parallel to a channel direction, of the source/drain regions of the p-channel MOS field effect transistor, comprising a silicon nitride film,
   wherein the device isolation film having the at least part comprising the silicon nitride film comprises an insulation film of a triple-layered structure of an oxide film, a nitride film and an oxide film.

13. The semiconductor device as claimed in claim 12, further including a stress applying film over a semiconductor substrate, and the stress applying film applying a stress to the channel region.

14. The semiconductor device as claimed in claim 13, wherein the stress applying film comprises a silicon nitride film.

15. A semiconductor device including a p-channel MOS transistor isolated by a device isolation film buried in a trench groove, and at least a part of the device isolation film, which is adjacent to parallel two sides, in parallel to a gate width direction, of source/drain regions of the p-channel MOS field effect transistor, comprising a silicon oxide film, and at least a part of the device isolation film, which is adjacent to parallel two sides, in parallel to a channel direction, of the source/drain regions of the p-channel MOS field effect transistor, comprising a silicon nitride film; and
   an n-channel MOS field effect transistor formed over a substrate, over which the p-channel MOS field effect transistor is formed.

16. The semiconductor device as claimed in claim 15, wherein the n-channel MOS field effect transistor comprises a source/drain length of not more than 1 micrometer.

17. The semiconductor device as claimed in claim 15, wherein the n-channel MOS field effect transistor has a tensile stress in at least one of the channel direction and the gate width direction.

18. The semiconductor device as claimed in claim 15, wherein the n-channel MOS field effect transistor is isolated by a device isolation film buried in a trench groove, and the device isolation film is adjacent to at least parallel two sides of source/drain regions of the n-channel MOS field effect transistor, and at least a part of the device isolation film adjacent to the at least parallel two sides comprises a silicon nitride film.

19. The semiconductor device as claimed in claim 18, wherein the device isolation film having the at least part comprising the silicon nitride film comprises an insulation film of a triple-layered structure of an oxide film, a nitride film and an oxide film.

20. A semiconductor device comprising:
   an n-channel MOS field effect transistor isolated by a device isolation film buried in a trench groove, and at least a part of the device isolation film adjacent to at least parallel two sides of source/drain regions of the n-channel MOS field effect transistor comprising a silicon nitride film; and
   a p-channel MOS field effect transistor formed over a substrate, over which the n-channel MOS field effect transistor is formed.

21. The semiconductor device as claimed in claim 20, further including a stress applying film over a semiconductor substrate, and the stress applying film applying a stress to the channel region.

22. The semiconductor device as claimed in claim 21, wherein the stress applying film comprises a silicon nitride film.

23. A semiconductor device comprising:
   an n-channel MOS field effect transistor isolated by a device isolation film buried in a trench groove, and at least a part of the device isolation film adjacent to at least parallel two sides of source/drain regions of the n-channel MOS field effect transistor comprising a silicon nitride film,
   wherein the device isolation film having the at least part comprising the silicon nitride film comprises an insulation film of a triple-layered structure of an oxide film, a nitride film and an oxide film.

* * * * *